(12) United States Patent
Hasz et al.

(10) Patent No.: US 6,921,014 B2
(45) Date of Patent: Jul. 26, 2005

(54) METHOD FOR FORMING A CHANNEL ON THE SURFACE OF A METAL SUBSTRATE

(75) Inventors: Wayne Charles Hasz, Pownal, VT (US); Venkat S. Venkataramani, Clifton Park, NY (US); Ching-Pang Lee, Cincinnati, OH (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/139,659

(22) Filed: May 7, 2002

(65) Prior Publication Data

US 2003/0209589 A1 Nov. 13, 2003

(51) Int. Cl.⁷ .......................... B23K 31/02; B23P 15/00
(52) U.S. Cl. .................... 228/122.1; 228/246; 228/254; 29/889.21; 29/889.721; 29/424
(58) Field of Search .......................... 228/122.1, 123.1, 228/124.1, 124.5, 124.6, 214, 215, 159, 161, 165, 174, 245, 246, 248.1, 248.5, 256; 415/116; 416/241 R; 29/889.721, 889.21, 424

(56) References Cited

U.S. PATENT DOCUMENTS

| | | | | |
|---|---|---|---|---|
| 2,641,439 A | * | 6/1953 | Williams | ................... 416/90 R |
| 4,623,087 A | * | 11/1986 | Conolly | ...................... 228/176 |
| 4,956,201 A | * | 9/1990 | Frick | ........................... 427/181 |
| 6,209,199 B1 | | 4/2001 | Cornu et al. | |
| 6,214,248 B1 | * | 4/2001 | Browning et al. | ............ 216/56 |
| 6,321,449 B2 | * | 11/2001 | Zhao et al. | .............. 29/890.01 |
| 6,368,672 B1 | * | 4/2002 | Thompson et al. | ......... 427/452 |
| 6,387,527 B1 | * | 5/2002 | Hasz et al. | ................. 428/472 |
| 6,582,194 B1 | * | 6/2003 | Birkner et al. | ............ 416/97 R |
| 6,602,053 B2 | * | 8/2003 | Subramanian et al. | .... 416/97 R |
| 2001/0001897 A1 | | 5/2001 | Zhao et al. | |
| 2002/0158112 A1 | * | 10/2002 | Rodhammer | ................ 228/218 |

FOREIGN PATENT DOCUMENTS

WO WO01/80286 A2 10/2001

OTHER PUBLICATIONS

EPO Search Report Dated Nov. 14, 2003.

* cited by examiner

Primary Examiner—Kiley S. Stoner
(74) Attorney, Agent, or Firm—Ann M. Agosti; Patrick K. Patnode

(57) ABSTRACT

A method for forming a channel within a coated, metal-based substrate is described. In one technique, a channel-forming material is first deposited on the substrate, followed by the deposition of a bonding agent, such as a braze. One or more coatings can then be applied over the substrate. In one embodiment, the channel is formed when the channel-forming material is subsequently removed. In another embodiment, the channel is formed due to the lack of adhesion between particular channel-forming materials and the overlying bonding agent. Related articles are also described, e.g., gas turbine components which include protective coatings and a pattern of cooling channels.

46 Claims, 4 Drawing Sheets

METHOD FOR FORMING A CHANNEL ON THE SURFACE OF A METAL SUBSTRATE

TECHNICAL FIELD

This invention generally relates to methods for the formation of hollow structures in the surface region of a coated metal substrate. In some specific embodiments, the invention is directed to methods for forming cooling channels at or near the surface of high-temperature articles covered with protective coatings.

BACKGROUND OF THE INVENTION

Various types of metals are used for components which may be exposed to a high-temperature environment, such as aircraft engine parts. A variety of approaches have been used to raise the operating temperature at which the metal components can be used. For example, one approach involves the use of protective coatings on various surfaces of the component, e.g., a gas turbine engine airfoil. The coatings are usually ceramic-based, and are sometimes referred to as thermal barrier coatings or "TBC's".

The TBC's are typically used in conjunction with internal cooling channels within the airfoil, through which cool air is forced during engine operation. As an example, a pattern of cooling holes may extend from a relatively cool surface of an airfoil to a "hot" surface which is exposed to gas flow at combustion temperatures of at least about 1000° C. The technique is sometimes referred to as "discrete hole film cooling".

In some instances, cooling structures must be located relatively close to a "hot" surface—even when such a surface is covered by a protective coating. For example, a coolant such as air is often passed through the inner surfaces of a turbine combustor liner, as well as being directed over an outside surface of the liner (i.e., "backside" cooling). This type of cooling mechanism is generally described in U.S. Pat. No. 5,822,853 (Ritter et al). The combustor liner usually has a thickness of about 1/10 inch (2.5 mm) to about 3/16 inch (4.7 mm).

Much work is being undertaken to design suitable patterns of cooling channels for thin-walled structures. For example, the Ritter patent describes the formation of cooling channels in cylindrical structures, such as the turbine combustors. In the Ritter technique, a double-wall assembly is constructed. The assembly includes an inner wall, channel-forming means, a sacrificial channel filler, and an outer wall. The channel-forming means lies between the two walls, and is filled with the channel filler. The assembly is hot-pressed to bond each wall to the other. Subsequent removal of the filler results in the desired cooling channel.

U.S. Pat. No. 5,075,966, issued to Mantkowski, also describes a method for making cooling channels and other hollow structures. The surface of a substrate is selectively patterned, and the pattern is then filled with a slurry. When solvent is removed, the slurry is transformed into a solid filler. A close-out layer is then deposited over the patterned surface and filler. Subsequent removal of the filler results in the formation of the desired hollow structure. The Mantkowski process can be employed to form hollow cooling channels within turbine engine components, e.g., blades and vanes.

There are certainly advantages associated with the technology embodied in the Mantkowski and Ritter patents. However, those processes may exhibit some disadvantages as well, for some applications. For example, the processes usually require the formation of grooves or channels in a metal surface. These features typically need to be patterned and then formed by some sort of casting or machining process. Casting and machining can be time-consuming. Moreover, these techniques are not always suitable for small-diameter structures, or for structures with complicated shapes. The limitations of these processes become more apparent when they are considered for use in advanced applications, e.g., channels in thin-walled, superalloy structures.

Thus, new methods for the formation of hollow structures in coated metal substrates would be of considerable interest in the art. The methods should obviate the use of casting or machining processes. They should also be capable of forming patterns of the structures, e.g., complicated patterns of cooling channels. The methods should also be compatible with processes used to apply the coatings to the substrates. Moreover, it would be advantageous if the new methods allowed one to easily change the shape of the hollow structures, or the composition of the material which forms the hollow region itself. This flexibility would be very useful for enhancing heat transfer characteristics, in the case of cooling channels for gas turbine applications.

SUMMARY OF THE INVENTION

A method for forming at least one channel within a coated, metal-based substrate is described herein. The method comprises the following steps:

(a) depositing a channel-forming material on a surface of the substrate, in a pattern which represents a selected shape for the channel;

(b) fusing a desired coating material to the surface with an underlying bonding agent, so that the coating covers the channel-forming material and a selected area of the surface; and (c) removing the channel-forming material, so as to form the channel.

The channel-forming material can vary widely. In some embodiments, it is a sacrificial material which is subsequently removed to form the channel. Typical sacrificial materials are described below. In other embodiments, the channel-forming material is usually a "stop-off" composition. The stop-off substantially prevents adhesion between the bonding agent and the substrate. This lack of adhesion or "wetting" also results in the formation of a channel. Thus, another embodiment for forming the channel comprises:

(A) depositing a stop-off material on the surface of the substrate, in a pattern which represents a selected shape for the channel, wherein the stop-off material is capable of preventing adhesion between the substrate and a bonding agent applied over the substrate and the stop-off material; and (B) fusing a desired coating to the substrate with the bonding agent, so that the coating covers the stop-off material and a selected area of the substrate, and the bonding agent which underlies the coating does not substantially adhere to the stop-off material, thereby forming a channel.

The present invention is especially useful in the preparation of a pattern of channels, and the channel-forming material is usually deposited in such a pattern. The channel pattern can serve as a circuit for coolant flow, e.g., in the wall of a turbine component. Different techniques for applying the channel-forming material to the substrate are described below, e.g., either directly, or as a pre-made foil.

The bonding agent is often a braze material, e.g., a nickel-based braze. Various techniques for applying the bonding agent are also described below. In brief, they typically involve the use of a slurry applied directly to the substrate; a tape; a foil, or a pre-formed bonding agent-channel-forming material structure.

The coating materials used herein can vary greatly. Usually, they are protective coatings designed to provide the substrate with resistance to heat or environmental degradation, as described below. In some embodiments, the coating material is a bond coat-TBC system, used frequently on gas turbine engine components. The term "coating material" is often used here in the singular form, for simplicity. It should be understood that the term is meant to embrace both single- and multiple coatings.

Moreover, the coating materials can be applied over the substrate in various ways, as in the case of the channel-former. For example, the coatings can be deposited directly on the substrate, e.g., by plasma spray. Alternatively, they can be pre-formed on a separate, temporary substrate, and then bonded to the substrate.

Another embodiment of this invention is directed to an article, comprising:

(I) a metal-based substrate having a surface which includes at least one channel; and (II) at least one coating disposed over the surface and the channel;

wherein the coating is attached to the substrate with a bonding agent. As described more fully below, the substrate is often a superalloy article, covered by one or more protective coatings. Moreover, such an article usually includes a pattern of channels which can provide various functions, e.g., serving as a cooling conduit.

Further details regarding the various features of this invention are found in the remainder of the specification, and in the accompanying drawings.

DETAILED DESCRIPTION OF THE INVENTION

The metal-based substrate of this invention can be formed from a variety of metals. The term "metal-based", as used herein, describes substrates which are primarily formed of metal or metal alloys, but which may also include some non-metallic components. "Non-metallic" refers to materials like ceramics, or intermediate phases. Usually, the substrate is a heat-resistant alloy, e.g., superalloys which typically have an operating temperature of up to about 1000–1150° C. The term "superalloy" is usually intended to embrace complex cobalt-, nickel-, or iron-base alloys which include one or more other elements, such as aluminum, tungsten, molybdenum, and titanium. Superalloys are described in many references. Nickel-base superalloys typically include at least about 40 wt % Ni. Cobalt-base superalloys typically include at least about 30 wt % Co. The actual configuration of a substrate may vary widely. For example, the substrate may be in the form of various turbine engine parts, such as combustor liners, combustor domes, shrouds, buckets, blades, nozzles, or vanes.

The term "channel", as used herein, refers to any hollow conduit through which a liquid or gas can flow. For example, the channel can be in the form of a tubular, enclosed passageway. Very often, the channel is a cooling passageway ("cooling channel") for a gas turbine component, e.g., as described in U.S. Pat. No. 5,075,966 (Mantkowski) and U.S. Pat. No. 5,822,853 (Ritter et al). Both of these patents are incorporated herein by reference. The cooling channels formed by the present invention are usually located on the substrate surface. Most often, they are covered by one or more coating layers having a total thickness in the range of about 1 mil (0.025 mm) to about 100 mils (2.54 mm).

Figure 1:
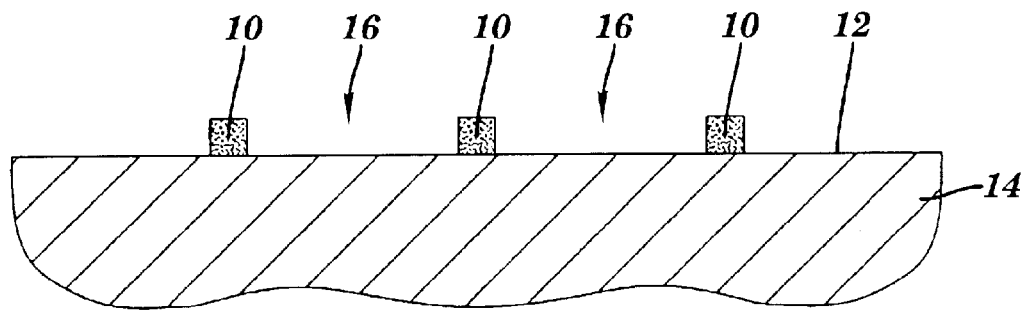
FIG. 1 is a cross-sectional view of a substrate in a processing stage for forming a channel, depicting deposition of a channel-forming material.
Figure 2:
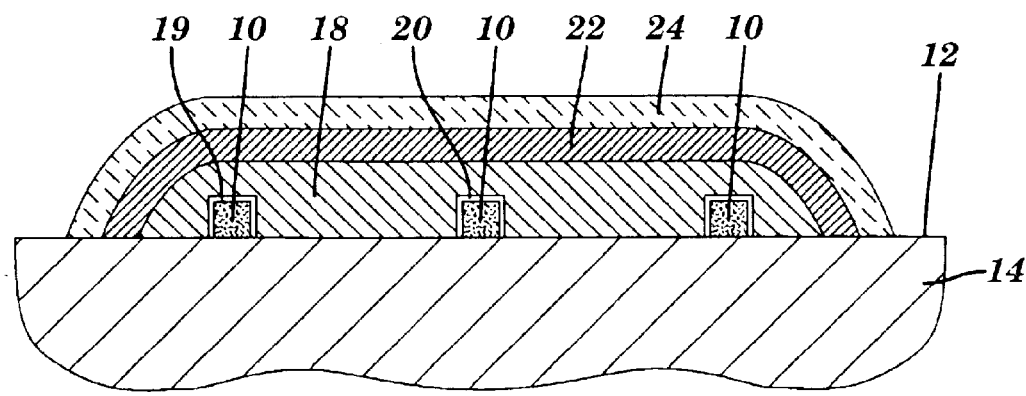
FIG. 2 is another cross-sectional view of the substrate, after the deposition of a bonding agent and coating system over the channels.

In one embodiment of the present invention, the channel-forming material (or "channel former") is a stop-off material 10, as depicted in FIG. 1. The stop-off material is deposited on the surface 12 of substrate 14. Placement of the stop-off material relative to open areas 16 generally determines the position of the channels which will eventually be formed. (For easier viewing, the stop-offs in FIGS. 1 and 2 are depicted as having a greater height than would generally be the case in this embodiment, although their dimensions can be varied. As mentioned below, the stop-off in some instances may simply constitute a thin layer of oxide which is formed (e.g., thermally) on the substrate).

In this embodiment, stop-off material 10 is one which is capable of preventing adhesion between the substrate and a bonding agent which is subsequently applied over the stop-off material. Those skilled in the art can determine the most appropriate material for a selected substrate and bonding agent (described below). In addition to preventing adhesion, the particular stop-off material should be capable of being removed without undue effort, if removal is desired. In that instance, the removal conditions (e.g., thermal conditions) should not adversely affect the substrate or bonding agent.

If the bonding agent is a braze material, the stop-off material usually comprises a composition selected from the group consisting of metal oxides, metal salts, and halide salts. In some preferred embodiments, metal oxide materials are preferred. Non-limiting examples include magnesium oxide, aluminum oxide, zirconia, and yttria. If the bonding agent is a high temperature epoxy or solder, as mentioned below, the stop-off composition is usually a metal oxide or metal salt.

Figure 3:
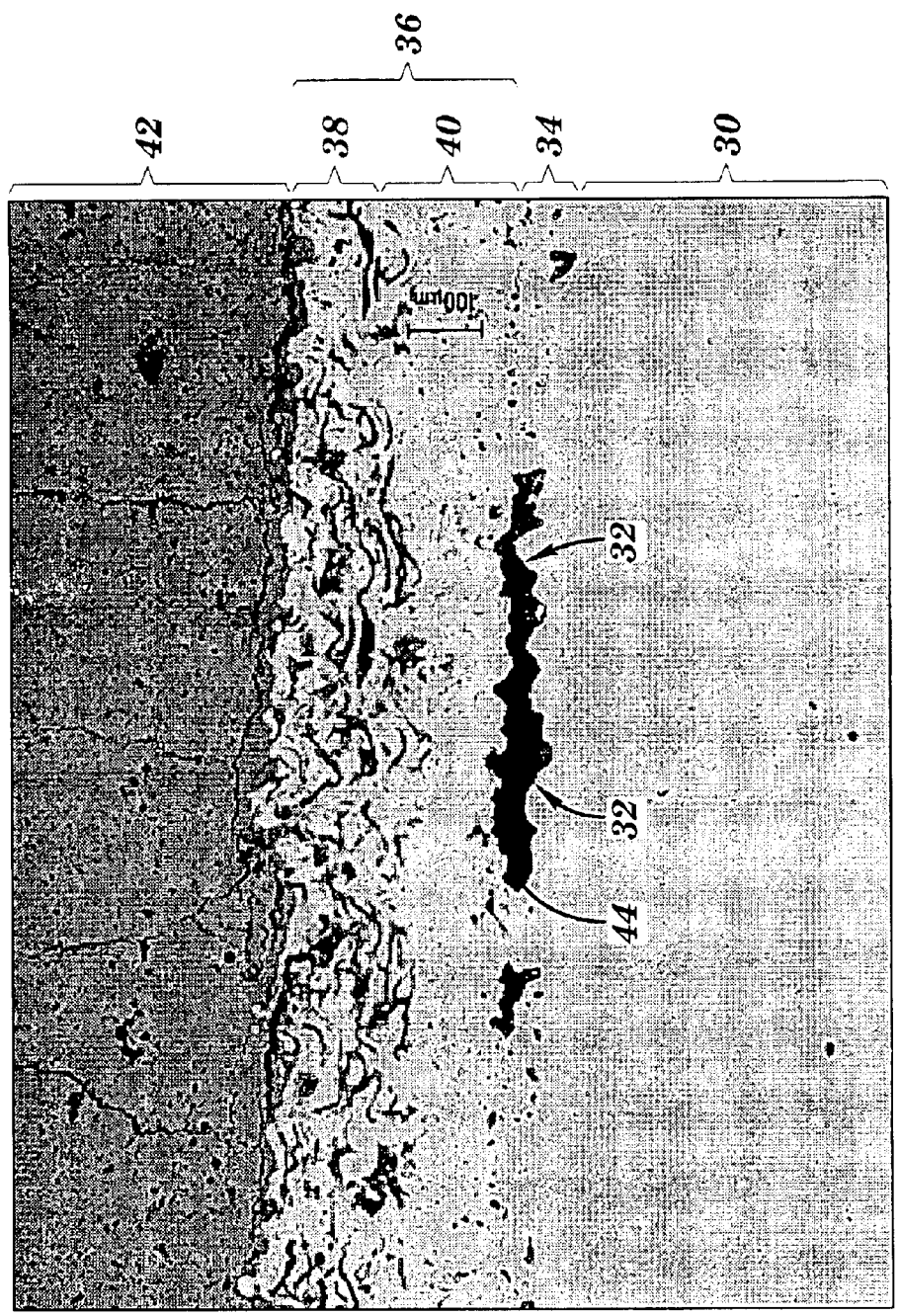
FIG. 3 is a photomicrograph of a cross-section of a coating system attached to a metal substrate with a bonding agent, in which a channel is incorporated beneath the bonding agent.

The stop-off material is deposited in a pattern which represents the selected shape of a channel, or multiple channels. The shape of the channels will be determined according to their purpose. In this embodiment, channels resulting from lack of adhesion between the stop-off and the bonding agent are relatively shallow. For example, the channels usually have an average depth which is about 5 microns to about 100 microns, and an average width which is about 20 microns to about 400 microns. As shown in FIG. 3 (described below), the shape of the channels in this embodiment is somewhat irregular.

In some embodiments, the stop-off material is applied directly to the substrate surface. Techniques for applying the stop-off material are known in the art. For example, stop-off wires, rods, and tapes are commercially available. They can be sized and cut to match the desired pattern, and then fused to the substrate surface. Alternatively, the stop-off material could be deposited in the form of a slurry, by various types of slurry deposition techniques. The slurry could be applied in a desired pattern, e.g., by pouring it through an appropriately-shaped mask.

The stop-off material can readily be applied to the surface by various other deposition techniques. Non-limiting examples include screen printing, ink jet printing, transfer printing, extrusion, and various lithographic techniques. All of these techniques are known in the art. For example, screen printing (e.g., silk screen printing) is described in the "Encyclopedia Americana", Intl. Ed., Volume 24 (1999), and in "The World Book Encyclopedia" (World Book Millennium 2000), Vol. 15. Ink jet printing is described, for example, in the "Encyclopedia Britannica", Vol. 21 Macropedia (1989). (For deposition techniques such as ink jet printing, the stop-off material is, in effect, the printing "ink".). Various lithographic techniques are described in the "Encyclopedia Americana" edition mentioned above, Vol. 17.

As a variation to the direct-deposition technique described above, the stop-off material can be pre-formed, before being applied to the substrate surface. As an example, the stop-off material can first be deposited onto a removable support sheet (e.g., a decal backing), by various deposition techniques. The material could be deposited in a pre-selected pattern, e.g., by using printing techniques. Non-limiting examples include screen-printing, laser printing and LED, which are described in the "Encyclopedia Britannica" and "Encyclopedia Americana" references mentioned above. As an illustration in the case of laser printing, the desired pattern of channels would be incorporated into a computer program as input-data. The program controls a beam of laser light and optical components, to selectively etch the pattern-images on a photoconductor drum. The images on the drum could then be electrostatically carried to the support sheet surface, for example. Those skilled in the art would be able to readily modify conventional printing processes to satisfy various requirements of the stop-off "ink", e.g., material viscosity, volatility, temporary electrostatic modification of the surface, and the like.

After deposition (and heating or curing, when necessary), the support sheet is removed, leaving the desired, free-standing stop-off pattern, which can be applied as a decal. (As described below in regard to other aspects of the invention, techniques are available for easily separating the material from a support sheet). The free-standing stop-off material can then be attached to a selected area of the substrate surface by any convenient means. This embodiment is especially useful when a large number of small channels are being formed—sometimes in intricate patterns. The embodiment is also very useful when the substrate itself is very curved or somewhat irregular.

As depicted in FIG. 2, a bonding agent 18 is then applied over surface 12. In this embodiment, the bonding agent fills open spaces 16 (see FIG. 1 also). The bonding agent serves as an attachment site for coatings subsequently applied. Various types of bonding agents can be used, depending in large part on the composition of the substrate and coatings. When the substrate is a section of a high-heat component, e.g., one made of superalloy material, the bonding agent is usually a braze. However, non-superalloy components used in lower temperature applications may not require braze-bonding. Instead, various other bonding agents could be used, such as high temperature epoxy or solder. While the teachings herein primarily relate to braze materials, those skilled in the art will be able to employ other bonding agents in analogous fashion, when appropriate.

A variety of braze alloy compositions may be used for the present invention. Some of them are described in the "Kirk-Othmer Encyclopedia of Chemical Technology", 3rd Edition, Vol. 21, pages 342 et seq. If the substrate is a nickel-base superalloy, the braze alloy usually contains at least about 40% by weight nickel. (Nickel-containing braze alloys or cobalt-containing braze alloys are usually used with cobalt-base superalloys). The braze alloy composition may also contain silicon and/or boron, which serve as melting point suppressants.

Exemplary nickel-base braze alloy compositions are provided below.

The components are designated in weight percent:

1) 4.5 Si, 14.5 Cr, 3.3 B, and 4.5 Fe, balance Ni;
2) 15 Cr, 3.5 B, balance Ni;
3) 4.5 Si, 3 B, balance Ni;
4) 4.2 Si, 7 Cr, 3 B, and 3 Fe, balance Ni;
5) 10 Si, 19 Cr, balance Ni;
6) 3.5 Si, 22 Co, 2.8 B, balance Ni;
7) 3.5 Si, 1.8 B, balance Ni;
8) 4.5 Si, 14 Cr, 3 B, and 4.5 Fe, balance Ni;
9) 17 Cr, 9 Si, 0.1 B, balance Ni;
10) 2.6 Si, 2 Cr, 2 B, and 1 Fe, balance Ni;
11) 15 Cr, 8 Si, balance Ni;
12) 10.1 Si, 19.0 Cr, balance Ni;
13) 4.5 Fe, 4.5 Si, 14.0 Cr, 3.1 B, 0.75 C, balance Ni;
14) 4.5 Fe, 4.5 Si, 14.0 Cr, 3.1 B, balance Ni;
15) 4.5 Si, 3.1 B, balance Ni;
16) 11.0 P, balance Ni;
17) 10.1 P, 14.0 Cr, balance Ni; and
18) 19 Cr, 7.3 Si, 1.5 B, balance Ni.

Some preferred nickel-base braze alloy compositions for the present invention comprise at least one of silicon, chromium, boron, and iron, with the balance being nickel. Silicon is sometimes preferred over boron. Mixtures of silicon and boron are sometimes employed.

Exemplary cobalt-base braze alloy compositions include:

1) 8 Si, 19 Cr, 17 Ni, 4 W, 0.8 B, balance Co; and
2) 17.0 Ni, 1.0 Fe, 8.0 Si, 19.0 Cr, 0.8 B, 0.4 C, balance Co.

It should be noted that other types of braze alloys may be used, e.g., precious metal compositions containing silver, gold, and/or palladium, in combination with other metals, such as copper, manganese, nickel, chrome, silicon, and boron. Mixtures which include at least one of the braze alloy elements are also possible. Many of the metal braze compositions are available from Praxair Surface Technologies, Inc.

When bonding agent 18 is a braze material, it is often applied over the substrate 14 in the form of a slurry. The slurry usually contains the braze material, metal powder, binder, and optionally, solvent. The metal powder is often in the form of discrete particles of the base metal in the substrate, e.g., nickel.

A variety of binder materials may be used in the braze slurry. Examples include water-based organic materials such as polyethylene oxide and various acrylics; or solvent-based binders. Conventional details related to the mixing of the slurry are described in various references, such as U.S. Pat. No. 4,325,754, which is incorporated herein by reference. Slurry compositions are also commercially available. Use of the braze slurry compositions is advantageous in various situations. For example, when the final substrate surface is irregular, or contains pits or crevices, the braze slurry can be used to fill such regions.

Various techniques are available for applying the braze slurry composition. For example, it can be sprayed, painted, or tape-cast directly onto the substrate. In addition to filling open spaces 16, the slurry (bonding agent) 18 usually covers at least a portion of the top surfaces 19 of stop-off layers 10 (FIG. 2). However, the slurry does not fully adhere to the stop-off material—even after fusing, as described below. Thus, a relatively small open area 20, surrounding each stop-off 10, remains. The open area 20 can serve as a channel, through which air can flow, for example. Any excess slurry applied over top surface 19 or stop-off layer 10 can easily be removed, e.g., by wiping.

As another alternative, the bonding agent can be applied over the substrate as a green braze tape. Brazing tapes like these are described in patent application Ser. No. 09/304,276 (W. Hasz), filed on May 3, 1999, and incorporated herein by reference. The tapes are commercially available. Alternatively, they can be formed from a slurry like the one described above (e.g., cast onto a removable substrate, dried, and then detached therefrom).

In yet another alternative technique for applying a braze bonding agent to the substrate, a free-standing braze foil can be employed. Methods for making such braze foils are known in the art. Moreover, the braze foils are commercially available from various sources, as described in U.S. Pat. No. 6,355,356, which is incorporated herein by reference. The braze foil can be tack-welded to the underlying layer, or an adhesive can be used.

The embodiment of FIGS. 1 and 2 usually includes a braze material as the bonding agent. However, it should be understood that open area 20 can alternatively be formed when using other types of bonding agents, e.g., the epoxy or solder materials mentioned above. As in the case of the braze, a stop-off composition to which the other bonding agents will not substantially adhere should be selected. It is expected that the metal oxide or metal salts described above should be sufficient stop-off materials for these alternative bonding agents.

When the bonding agent is a slurry, or a green tape which contains volatile components, a heating step is typically carried out, to "cure" the bonding material. This step serves to remove any volatiles which would otherwise be vaporized in any subsequent high-heat treatment, e.g., a plasma deposition step. When the bonding material is a braze composition, conventional brazing operations are employed for this step. Brazing steps and conditions are more fully described below, since they also relate to the subsequent attachment of one or more coatings to the braze. This brazing step is usually carried out under very low pressure (e.g., less than about $10^{-1}$ torr), or in a vacuum.

As yet another alternative, both the stop-off material and the bonding agent can be pre-formed, as a single foil structure, before being applied to the substrate surface. In this embodiment, the stop-off material can first be deposited onto a removable support sheet, as described previously. The bonding agent, e.g., a braze-slurry material, is then applied over the stop-off, forming a bilayer. (Thus, the bilayer would comprise a lower sublayer of the channel-forming material, i.e., the stop-off in this instance, and an upper sublayer of the bonding agent). When appropriate, the composition of solvent-binder systems for the stop-off and bonding agent can be adjusted to ensure sufficient contact between the two.

As described previously, the bonding agent does not fully adhere to the stop-off material, leaving a small open area (area 20 in FIG. 2) which can serve as a channel. The support sheet is removed, leaving a free-standing bilayer which includes the intervening open area. The bilayer can then be applied or attached to a selected area of the substrate surface. (The stop-off surface would be placed in contact with the substrate, while the opposite surface of the bilayer, i.e., the bonding agent layer, would face outward, exposed for subsequent coating deposition). Structures such as this bilayer can be temporarily held in place on the substrate, prior to being fused, by various techniques. As one example, the bilayer can be exposed to a solvent that partially dissolves and plasticizes any binder in the bonding agent material, causing the structure to conform and adhere to the substrate surface. (Techniques like this are described in the above-referenced patent application Ser. No. 09/304,276).

As an additional variation, the stop-off material can be deposited onto a sheet of the bonding agent, e.g., onto the braze foil described above. (The stop-off can be deposited in a pattern, or patterned afterward by conventional techniques). This stop-off/foil structure can then be attached to the substrate in the desired area, with the stop-off in direct contact with the substrate. The structure can be temporarily held in place by various techniques. For example, an adhesive can be used. Alternatively, the overlying foil can be tack-welded to the substrate. Fusing (e.g., brazing) of the stop-off/foil structure can then be carried out by the conventional techniques described below.

In the overall embodiment described above, there is no need to remove the stop-off material. In other words, the channels which are formed from lack of adhesion between the stop-off and the bonding agent are already present. However, it may sometimes be desirable to remove the stop-off material, e.g., for the purpose of slightly enlarging the channel dimensions. Removal of stop-off materials is discussed more fully below, in regard to other embodiments. In the present instance, removal of the stop-off material can be undertaken prior to the deposition of one or more subsequent coatings over the braze, or after the deposition of those coatings.

As mentioned above, one or more coating materials are applied over the substrate, covering all or most of the bonding agent. In some embodiments, the coating materials are applied directly to the substrate, i.e., over the bonding agent. The choice of a coating material will of course depend on the end use requirements for the article. For example, the coating may be used primarily for thermal protection, e.g., a thermal barrier coating (TBC). Alternatively, the coating might be one which offers environmental protection, i.e., protection of a substrate from the adverse effects of oxidation, corrosion, and chemical attack. The thickness of the coating material will also depend on the requirements for the article, as well as material costs.

Very often, the coating applied over the bonding agent is metallic. Many different types of metallic coatings may be employed. In the case of turbine articles, the metallic coating often comprises a material of the formula MCrAl(X), where M is an element selected from the group consisting of Ni, Co, Fe, and combinations thereof. In that formula, "X" is an element selected from the group consisting of Y, Ta, Si, Hf, Ti, Zr, B, C, and combinations thereof. Some of the preferred alloys of this type have a broad composition (in weight percent) of about 17% to about 23% chromium; about 4% to about 13% aluminum; and about 0.1% to about 2% yttrium; with M constituting the balance.

Other types of metallic coatings can be used as well. Examples include aluminide-type coatings such as nickel aluminide or platinum-nickel-aluminide. Wear-resistant coatings (often referred to as "wear coatings") may also be used. Examples include those formed of chromium carbide or cobalt-molybdenum-chromium-silicon.

An MCrAl(X) coating like that described above can, by itself, provide some degree of corrosion protection and oxidation protection to the substrate. However, such a coating is frequently used as a bond layer for a subsequently-applied ceramic coating, e.g., a thermal barrier coating. FIG. 2 depicts the presence of bond coat 22 and overlying ceramic coating 24. Often, the ceramic coating is a thermal barrier coating. These are typically (but not always) zirconia-based. As used herein, "zirconia-based" embraces ceramic materials which contain at least about 70% zirconia, by weight. In preferred embodiments, the zirconia is chemically stabilized by being blended with a material such as yttrium oxide, calcium oxide, magnesium oxide, cerium oxide, scandium oxide, or mixtures of any of those materials.

The coating materials employed herein can be applied by many different techniques. The choice of a particular technique will of course depend on the type of coating material being deposited. As an example, metallic coatings (e.g., the MCrAl(X) coatings) can be applied directly to the substrate by a thermal spray technique. Examples include air plasma spray (APS), vacuum plasma spray (VPS), and high velocity oxy-fuel (HVOF). Other deposition techniques could be used as well, such as sputtering. Ceramic coatings (e.g., a TBC) are typically applied by APS; physical vapor deposition (PVD), or electron beam physical vapor deposition (EBPVD).

There are alternatives to the direct deposition of the coating to the substrate, described above. For example, the coating material (e.g., a bond coat) can be pre-formed and then applied over the substrate, i.e., over the bonding agent disposed on the substrate. As an illustration, the coating can be applied over the substrate as a foil, i.e., a thin sheet which is sometimes referred to as a "coating preform". This technique is described, for example, in U.S. patent application Ser. No. 09/411,222, filed on Oct. 4, 1999, which is incorporated herein by reference. The coating foil can be made by a variety of techniques. For example, the coating material, usually in the form of a powder, can be deposited onto a removable support sheet (typically metallic) as a thin layer of metal. The powder can be applied to the support sheet by any of the thermal spray techniques mentioned above, or by sputtering, PVD, and the like.

After the coating has been deposited on the support sheet, the latter is removed, leaving the desired, free-standing metal foil. Various techniques can be used to remove the foil from the support sheet. For example, if the support sheet is intentionally not grit-blasted prior to deposition of the coating metal, adhesion of the metal to the support sheet will be relatively low, permitting easy detachment of the foil. Alternatively, a conventional release coating can be applied to the removable support sheet, prior to application of the coating material.

Moreover, multiple coatings could be successively applied over the bond coating onto the removable support sheet. As an example, a zirconia-based TBC could be applied over the bond coat by various techniques, such as APS. After detachment from the support sheet, the free-standing foil would include both the bond coat and the TBC.

The foil can then be cut to a size appropriate for the site on the substrate where the coating is desired, prior to being fused to the substrate. Various techniques can be used to temporarily hold the foil in place before fusing. For example, an adhesive could be used, i.e., one which completely volatilizes during the fusing step. Alternatively, the foil could be bolted, clamped, or tack-welded into place.

The fusing step for attaching the foil of coating material to the substrate can be carried out by various techniques. As described above, though, it is usually carried out as a conventional brazing operation. (As used herein, "brazing" is generally meant to include any method of joining metals that involves the use of a filler metal or alloy). One exemplary reference for details regarding brazing is the text "Modern Metalworking", by J. R. Walker, The Goodheart-Willcox Co., Inc., 1965, pp. 29–1 to 30–24.

Those of ordinary skill in the art are familiar with other details regarding brazing. Brazing temperatures depend in part on the type of braze alloy used, and are typically in the range of about 525° C. to about 1650° C. In the case of nickel-based braze alloys, braze temperatures are usually in the range of about 800° C. to about 1260° C. When possible, brazing is often carried out in a vacuum furnace. The amount of vacuum will depend in part on the composition of the braze alloy. Usually, the vacuum will be in the range of about $10^{-1}$ torr to about $10^{-8}$ torr.

As alluded to previously, the fusing step can be carried out by techniques other than brazing. For example, a torch or other heating technique, e.g., a welding technique, can be used for fusing the coating foil to the substrate. These techniques represent alternatives to the vacuum furnace.

Regardless of what fusing technique is employed, the resulting coating is metallurgically bonded to the substrate. Attachment of the coating to the substrate occurs through the layer of the bonding agent. However, in this embodiment, there is substantially no attachment of the coating to the substrate in those areas where the bonding agent lies over the stop-off material, because of the lack of adhesion (described previously) between the bonding agent and stop-off. Thus, a channel (i.e., open area 20 in FIG. 2) remains in the surface region of the coated substrate. In this embodiment, the channel is depicted as substantially surrounding stop-off 10. (The stop-off, in effect, serves as the bottom surface of the channel). However, the specific shape of the channel in any particular instance will depend in part on the degree of "non-adherence" between stop-off 10 and bonding agent 18. If desired, the channel could be slightly enlarged at this stage, by removing the stop-off material.

FIG. 3 is a photomicrograph of a cross-section of a coating system applied over a substrate. The substrate 30 is formed of a nickel-base superalloy. A very thin oxide layer (not visible in the photomicrograph) was naturally formed on the surface of the substrate, in the general region designated by reference numerals 32.

The coating system was a free-standing, pre-formed bond coat/TBC foil. The preparation of such a foil is described in the pending application mentioned earlier, Ser. No. 09/411, 222. The foil included a NiCrAlY-type bond coat and an overlying zirconia-yttria TBC. (Both coatings had been air plasma-sprayed onto a temporary substrate, and then detached therefrom).

The coating foil was attached to the substrate with a green braze tape. The tape had the following composition: 10 wt. % Si, 19 wt. % Cr, balance Ni. Vacuum-brazing was carried out for 30 minutes at 2100° F. (1149° C.). The layer of braze, having a thickness of about 0.001 inch/0.025 mm, is visible in FIG. 3, in the general area designated by reference numeral 34. (It should be understood that a braze foil, e.g., as generally described previously, could have been used instead of the braze tape.)

In this exemplary embodiment, bond coat 36 includes two general regions. Region 38 is characterized by the typical, "spongy" microstructure resulting from air-plasma spraying of the NiCrAlY material. Region 40 initially had the same microstructure, but was subsequently infiltrated with the braze material during a heat treatment, thereby densifying the region. Coating 42 is the zirconia-based TBC.

FIG. 3 shows that the foil-coating (i.e., bond coat 36 and TBC 42) is completely brazed to the metal substrate 30, except in those areas where the oxide layer is present, i.e., above surface region 32. The oxide in that area served as a stop-off, preventing wetting of the braze. Thus, a void or channel 44 was formed, as described previously. One or more other voids (also solid black areas) which can serve as channels are also depicted at about the same vertical position of the micrograph.

In another embodiment of the present invention, a sacrificial filler is employed as the channel-former. Removal of the filler results in formation of the channel. Thus, this embodiment is not dependent on whether or not the bonding agent adheres to the underlying filler.

Figure 4:
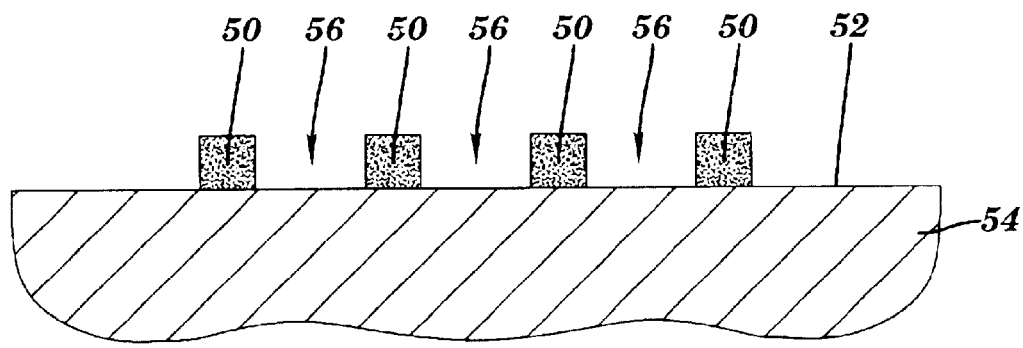
FIGS. 4–8 are detailed, cross-sectional views of the steps of an exemplary, alternative process for fabricating channels within an article provided with one or more coatings.

As shown in FIG. 4, sacrificial filler 50 is first deposited on the surface 52 of substrate 54. Placement of the sacrificial filler relative to open areas 56 defines the geometry of the channels which will eventually be formed. As a non-limiting example, a combustion chamber for a gas turbine might require cooling channels having an average width and height (depth) of about 0.005 inch (0.127 mm) to about 0.050 inch (1.27 mm). In preferred embodiments, the cooling channels have an average width and height of about 0.010 inch (0.254 mm) to about 0.025 inch (0.635 mm). The sacrificial filler would therefore have a substantially complementary dimension.

A variety of materials may be used as the sacrificial filler for this embodiment. Non-limiting examples include the stop-off materials mentioned above (although greater amounts of the material would usually be used in this embodiment). Various other inorganic compounds could be employed, as described in U.S. Pat. No. 6,321,449 (Zhao et al), incorporated herein by reference. They include various metal oxides, metal halides, metal borates, metal sulfates, metal aluminates, and combinations thereof. Some specific examples are sodium chloride, potassium borate, nickel chloride, magnesium sulfate, nickel fluoride, sodium aluminate; and mixtures of sodium aluminate and sodium aluminosilicate. When used in the form of a paste, many of these inorganic compounds are combined with a binder and/or a solvent. Non-limiting examples of the binders are water-based gels, e.g., Vitta Gel™. Choice of a particular solvent will depend on the type of binder used. Typical examples include water, alcohols, acetone, sodium hydroxide solutions, and potassium hydroxide solutions. Carbon-based materials, such as graphite, can also be used as the sacrificial filler.

As in the embodiment described previously (i.e., where only stop-off-type materials were used), the sacrificial filler is deposited in a pattern which represents the selected shape of a channel, or multiple channels. In this embodiment, though, the required volume of filler is that which is sufficient to serve as a "core" for the required dimensions of the cooling channels. The techniques used above for deposition, such as lithography or slurry deposition, can be used here as well, as long as they can be adapted to handle the required amount of filler. Moreover, the stop-off material can be pre-formed on a separate support sheet, as described above, and subsequently deposited on the substrate of the article.

Some of the sacrificial materials, like graphite, may react with certain bonding agents, like the metal brazes. Therefore, in some instances, it may be desirable to pre-coat the sacrificial material, (e.g., graphite rods or tapes) with one of the stop-off materials described previously. This stop-off coating will serve to substantially prevent reaction between the sacrificial material and the bonding agent. The sacrificial material will then be substantially removed during one of the fusing (heating) steps discussed below.

Figure 5:
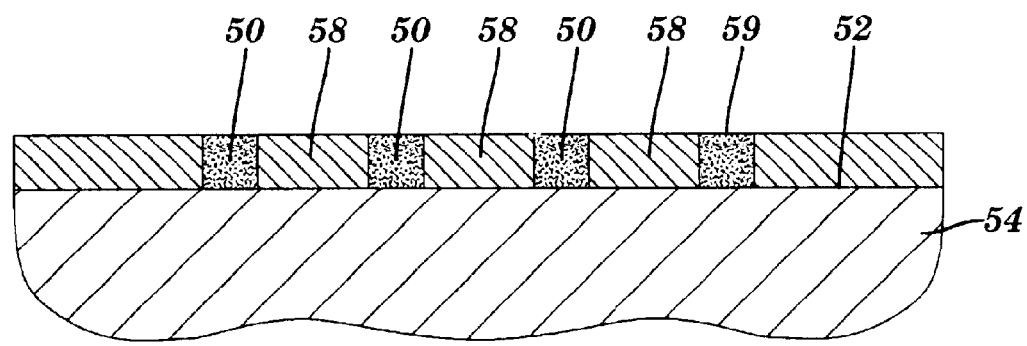

As depicted in FIG. 5, bonding agent 58 is then applied over surface 52. The bonding agent fills open spaces 56 (see FIG. 4 also), and serves as an attachment site for coatings subsequently applied. (The bonding agent will generally constitute the walls of the channels that are eventually formed, as will be apparent in the successive figures). The types of bonding agents which are suitable have also been described previously. Braze compositions are usually employed. The bonding agent usually covers at least a portion of the top surfaces 59 of sacrificial filler-layers 50 (FIG. 5). The bonding agent may or may not fully adhere to the sacrificial material. Adhesion or the lack thereof will depend on various factors, e.g., material compositions and densities, but is not a critical feature for this embodiment. When, the bonding agent is in semi-solid form, e.g., a slurry, the excess can be wiped off after deposition. Moreover, a heating step may be necessary (as described previously), to remove any volatile components from the bonding composition.

As in the embodiment discussed above, the sacrificial material and the bonding agent can be pre-formed, as a single structure. This bilayer structure, formed on a removable support sheet, would then be detached from the support sheet. The structure could then be applied to the desired area of the final substrate. As another alternative (and analogous to the first embodiment), the sacrificial material can be applied directly to a foil of the bonding agent, e.g., a braze foil. The foil would then be fused to the substrate.

Figure 6:
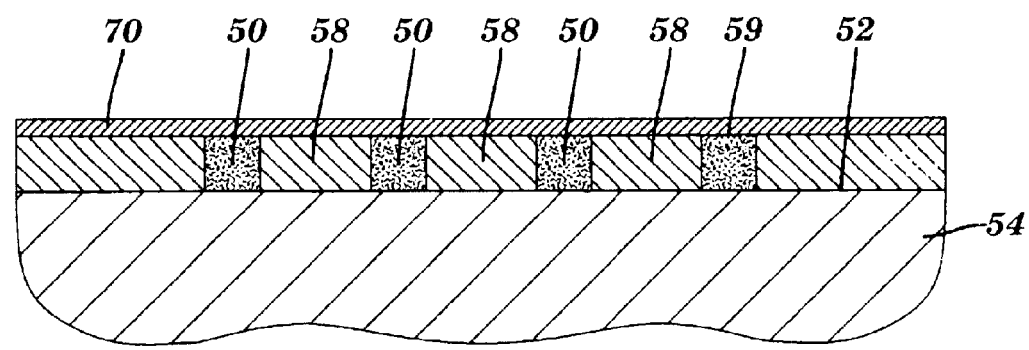

At this stage, one or more coatings can be applied over the substrate, as described previously. As shown in FIG. 5, the bonding agent 58 which fills open spaces 56 (see FIG. 4), and which may also cover sacrificial layer top surfaces 59, is usually sufficient for fusing the coatings to the substrate. However, in some preferred embodiments—especially when the bonding agent is a braze material—a tape (sometimes referred to as a "bonding sheet") is applied prior to coating deposition. As shown in FIG. 6, the tape 70 is disposed over bonding agent 58 and sacrificial layers 50. The tape provides a more uniform attachment site for the coatings, when stronger bonding is required.

In the case of a braze-based bonding agent, tape 70 is usually a brazing sheet. Various types of brazing tapes are described in patent application Ser. No. 09/304,276 (W. Hasz), referenced above. As an example, a green braze tape may be used. Such tapes are commercially available (e.g., Amdry™ braze tapes). Alternatively, they can be formed by various techniques, e.g., by tape-casting a slurry of metal powder and binder in a liquid medium, such as water or an organic liquid. The metal powder is usually a material similar to that of the substrate, e.g., a nickel- or cobalt-based composition. The brazing tape usually has a thickness in the range of about 25 microns to about 500 microns, and preferably, in the range of about 50 microns to about 250 microns. (Braze foils of this type often have a thickness in the range of about 10 microns to about 150 microns, and more often, in the range of about 10 microns to about 40 microns.)

Figure 7:
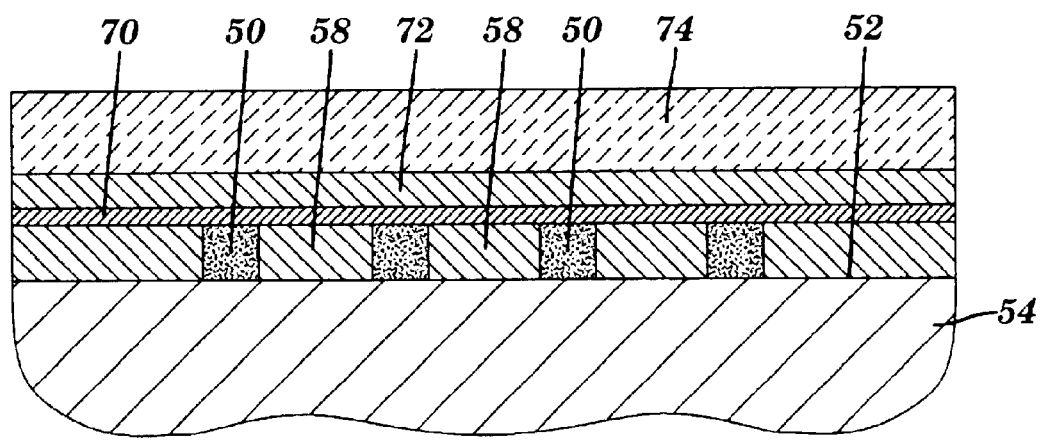

The coating materials are then applied over the substrate, covering tape 70 (or directly covering bonding agent 58 and sacrificial layer 50, if no tape is used). FIG. 7 is exemplary, and depicts bond coat 72, and overlying ceramic coating 74. However, as discussed above, many different types of coatings may be employed (single or multiple). Furthermore, the coatings may be pre-formed on a separate substrate, and then applied to the final substrate.

In those embodiments in which the coatings are pre-formed, a convenient technique for ensuring the size and shape of the channels can be employed. Slots or other apertures could be cut (e.g., machined) into the bottom surface (underside) of the coating pre-form. For example, the slots would be cut into the underside of the bond coat, in a bond coat/TBC bilayer structure. The shape of the slots could be varied, depending upon requirements such as coolant flow efficiency. When the bilayer structure is then attached to the substrate and heated, the bonding agent would fuse the lowest portion of the bilayer to the substrate surface. Gaps would remain, due to the "cut-out" areas, and they would serve as the shaped channels.

The fusing step is then carried out, as generally described above. In the case of a braze bonding agent, conventional brazing operations are undertaken. The fusing step densities the bonding agent, and provides a secure attachment between the coatings and the underlying substrate. As mentioned previously, alternative heating techniques are possible for carrying out the fusing step, e.g., torch-welding.

Figure 8:
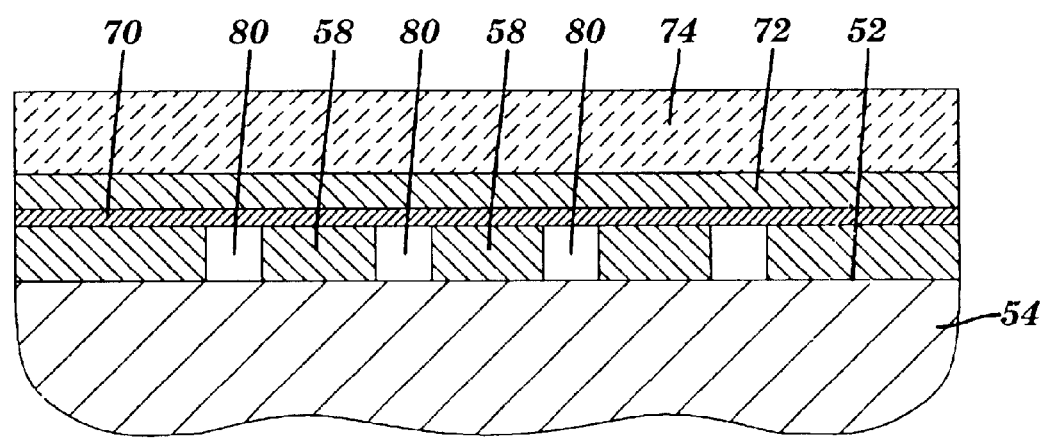

As shown in FIG. 8, the sacrificial filler 50 is then removed, so as to form the desired channels 80. Various techniques are available for removing the sacrificial filler. Many are described in U.S. Pat. Nos. 5,075,966 and 6,321,449, mentioned previously. Choice of a particular technique will depend in part on the composition of the filler. The technique employed should be one which will not adversely affect the substrate, bonding agent, or coating material. (As an example, strong acids could remove many types of sacrificial fillers, but could also damage metallic components).

A water-wash may be used as the removal technique for a water-soluble sacrificial material. Chemical leaching or vacuum extraction might be used for other types of materials. Etching with solvents such as water, alcohols, acetone, or alkali metal hydroxides may also be employed. Another technique which is sometimes suitable is ultrasonic removal.

If the sacrificial material is organic or partially organic, combustion could be employed. For example, the component could be heated to a temperature high enough to volatize or burn-off the sacrificial filler. Residual debris could then be removed by an air-blast, alone or in combination with one of the other techniques mentioned above. For embodiments in which a coating material is applied directly over the bonding agent by a high-temperature technique, e.g., a plasma technique, the plasma temperatures might be sufficient to volatize the sacrificial material.

As another alternative, the sacrificial filler may be removed at an earlier stage of the process. For example, the filler may be removed after the deposition and curing of bonding agent 58 (FIG. 5). The filler may also be removed after the application of the optional bonding tape, e.g., a braze tape, as discussed above. However, if the subsequent coating deposition process is carried out at high temperatures, e.g., a plasma process, then the filler is often left in place until coating deposition is complete. This helps to prevent any deformation of the eventual channel during coating deposition.

Another embodiment of this invention relates to an article, prepared according to the processes discussed previously. Thus, the article includes a metal substrate 54, as depicted in FIG. 8, which is often (but not always) formed from a superalloy material. At least one channel 80 is incorporated into the article, generally on top of substrate surface 52. (In this embodiment, the cooling channels are initially substantially filled with sacrificial filler, e.g., filler 50, as shown in FIG. 6). The sidewalls of the channel are generally formed by the bonding agent described above. As alluded to earlier, the shape of the channels may vary widely. As a non-limiting example, they may be shaped and positioned like the "grooves" or "hollow interior regions" described in U.S. Pat. Nos. 6,321,449 and 5,075,966 (respectively), noted previously. Cooling channels incorporated into a turbine engine component would typically be present in a pre-selected pattern, according to their specific function.

The article further includes at least one coating disposed over the substrate and the channels. For example, FIG. 7 depicts bond coat 72 and ceramic coating 74, as described above. Typical thicknesses for these coatings were mentioned above, and are also described in referenced patent application Ser. No. 09/411,222. The coating is fused to the substrate by an intervening layer of bonding agent, e.g., the braze material discussed previously.

Still another embodiment is directed to an article which is prepared when the use of a stop-off material prevents substantial adhesion of an overlying bonding agent, as described above. Thus, the stop-off material generally forms the bottom surface of the channel. The desired protective coatings noted above can also be employed for this type of article.

Having described preferred embodiments of the present invention, alternative embodiments may become apparent to those skilled in the art, without departing from the spirit of this invention. Accordingly, it is understood that the scope of this invention is to be limited only by the appended claims.

What is claimed is:

1. A method for forming at least one channel within a coated, metal-based substrate, comprising the following steps:
   (a) depositing a channel-forming material on an unpatterned portion of a surface of the substrate, in a pattern which represents a selected shape for the channel; then
   (b) applying and fusing a desired coating material to the surface with an underlying bonding agent, so that the bonding agent fills in the spaces defined by the channel-forming material and the coating covers the channel-forming material and a selected area of the surface; and then
   (c) removing the channel-forming material, so as to form the channel.

2. The method of claim 1, wherein the channel-forming material comprises a composition selected from the group consisting of metal oxides, metal halides, metal borates, metal sulfates, metal aluminates, carbon-based materials, and combinations thereof.

3. The method of claim 2, wherein the channel-forming material further comprises at least one constituent selected from the group consisting of a binder and a solvent.

4. The method of claim 2, wherein the channel-forming material comprises at least one constituent selected from the group consisting of sodium chloride, potassium borate, magnesium sulfate, nickel chloride, nickel fluoride, sodium aluminate, sodium aluminosilicate, magnesium oxide, aluminum oxide, zirconia, yttria, graphite, and combinations of any of the foregoing.

5. The method of claim 1, wherein the channel-forming material is deposited in a form selected from the group consisting of wires, rods, tapes, and slurry compositions.

6. The method of claim 1, wherein the channel-forming material is deposited by a technique selected from the group consisting of screen printing, ink jet printing, transfer printing, slurry deposition, and extrusion.

7. The method of claim 1, wherein multiple channels are formed in a pattern for a coolant system.

8. The method of claim 1, wherein the channel-forming material is deposited directly on the substrate surface.

9. A method for forming at least one channel within a coated, metal-based substrate, comprising the following steps:
   (a) depositing a channel-forming material on a surface of the substrate, in a pattern which represents a selected shape for the channel, wherein the channel-forming material is in the form of a free-standing foil which is attached to the substrate surface;
   (b) fusing a desired coating material to the surface with an underlying bonding agent, so that the coating covers the channel-forming material and a selected area of the surface; and
   (c) removing the channel-forming material, so as to form the channel.

10. The method of claim 9, wherein the free-standing foil is prepared by depositing the channel-forming material in a desired pattern onto a removable support sheet, and then separating the channel-forming material from the support sheet.

11. The method of claim 1, wherein the bonding agent is applied directly to the substrate, prior to the fusing of the desired coating material.

12. The method of claim 11, wherein the bonding agent is a braze material, and is applied to the substrate in the form of a slurry.

13. A method for forming at least one channel within a coated, metal-based substrate, comprising the following steps:
   (a) depositing a channel-forming material on a surface of the substrate, in a pattern which represents a selected shape for the channel;
   (b) fusing a desired coating material to the surface with an underlying bonding agent, so that the coating covers the channel-forming material and a selected area of the surface, wherein the bonding agent and the channel-forming material are in the form of a free-standing bilayer foil which is attached to the substrate, said bilayer comprising a lower sublayer of the channel-forming material and an upper sublayer of the bonding agent; and
   (c) removing the channel-forming material, so as to form the channel.

14. The method of claim 13, wherein the free-standing bilayer foil is prepared by first depositing the sublayer of the channel-forming material onto a removable support sheet, and then depositing the bonding agent over the channel-forming material, followed by separating the bilayer from the support sheet.

15. The method of claim 1, wherein the bonding agent is a braze material.

16. The method of claim 15, wherein the braze material is an alloy which comprises at least one metal selected from the group consisting of nickel, cobalt, iron, a precious metal, and a mixture which includes at least one of the foregoing.

17. The method of claim 16, wherein the braze material comprises at least about 40% by weight nickel, and at least one additional element selected from the group consisting of silicon, chromium, boron, and iron.

18. The method of claim 16, wherein the braze material comprises silicon, chromium, and nickel.

19. The method of claim 1, wherein fusing includes applying the bonding agent over the channel-forming material and the surface and then applying the desired coating over the bonding agent.

20. The method of claim 1, wherein the desired coating is in the form of a free-standing coating foil which is fused to the substrate with the bonding agent.

21. The method of claim 20, wherein the toil is prepared by applying the coating material to a removable support sheet to form the foil, followed by separation of the foil of iron the removable support sheet.

22. The method of claim 21, wherein the coating material is applied to the removable support sheet by a technique selected from the group consisting of vacuum plasma deposition, high velocity oxy-fuel, and air plasma spray.

23. The method of claim 20, wherein fusing is carried out by exposing the bonding agent to a suitable bonding temperature.

24. The method of claim 23, wherein the bonding agent is a braze material.

25. The method of claim 1, wherein the desired coating material is selected from the group consisting of thermal barrier coatings, environmental protection coatings, and wear coatings.

26. The method of claim 1, wherein the desired coating is a metallic coating.

27. The method of claim 26, wherein the metallic coating comprises MCrAl(X), where M is an element selected from the group consisting of Ni, Co, Fe, and combinations thereof; and X is an element selected from the group consisting of V, Ta, Si, Hf, Ti, Zr, B, C, and combinations thereof.

28. The method of claim 26, wherein the metallic coating is a bond coating.

29. The method of claim 28, wherein the bond coating is covered by a ceramic overcoat.

30. The method of claim 29, wherein the ceramic overcoat is a zirconia-based thermal barrier coating.

31. A method for forming cooling channels within a superalloy substrate covered by a metallic bond coat and an overlying thermal barrier coating, comprising the following steps:
   (I) attaching a free-standing bilayer foil to a surface of the substrate, said bilayer comprising a lower sublayer of a channel-forming material and an upper sublayer of a braze material, wherein the bilayer has a shape which represents a selected shape for the cooling channels, and the lower sublayer contacts a pre-selected area of the substrate surface;
   (II) fusing the bond coat and the thermal barrier coating to the substrate surface with the braze material, so that the bond coat and the thermal barrier coating cover the channel-forming material and the pre-selected area of the substrate surface; and then
   (III) removing the channel-forming material, so as to form the desired channels.

32. The method of claim 31, wherein the superalloy substrate is at least a portion of a turbine engine component.

33. The method of claim 31, wherein the channel-forming material comprises a composition selected from the group consisting of metal oxides, metal halides, metal borates, metal sulfates, metal aluminates, and combinations thereof.

34. The method of claim 31, wherein the bond coat comprises MCrAl(X), where M is an element selected from the group consisting of Ni, Co, Fe, and combinations thereof; arid X is an element selected from the group consisting of Y, Ta, Si, Hf, Ti, Zr, B, C, and combinations thereof; and the thermal barrier coating comprises yttria-stabilized zirconia.

35. A method for forming a channel within a coated, metal-based substrate, comprising the following steps:
- (A) depositing a channel-forming material on the surface of the substrate, in a pattern which represents a selected shape for the channel, wherein the channel-forming material is capable of preventing adhesion between the substrate and a bonding agent applied over the substrate and the channel-forming material; and
- (B) fusing a desired coating to the substrate with the bonding agent, so that the coating covers the channel-forming material and a selected area of the substrate, and the bonding agent which underlies the coating does not substantially adhere to the channel-forming material, thereby forming a channel.

36. The method of claim 35, wherein the bonding agent is a braze material.

37. The method of claim 35, wherein the channel-forming material is a stop-off composition selected tram the group consisting of metal oxides, metal salts, and halide salts.

38. The method of claim 37, wherein the channel-forming material is a stop-off composition comprising a material selected from the group consisting of magnesium oxide, aluminum oxide, zirconia, and yttria.

39. The method of claim 35, wherein the channel-forming material is deposited in a form selected from the group consisting of stop-off wires, rods, tapes, and slurry compositions.

40. The method of claim 35, wherein fusing includes applying the bonding agent over the channel-forming material and the surface and then applying the desired coating over the bonding agent.

41. The method of claim 35, wherein the desired coating is in the form of a free-standing coating foil which is fused to the substrate with the bonding agent.

42. The method of claim 41, wherein the foil is prepared by applying the coating material to a removable support sheet to form the foil, followed by separation of the foil from the removable support sheet.

43. The method of claim 42, wherein the coating material is applied to the removable support sheet by a technique selected from the group consisting of vacuum plasma deposition, high velocity oxy-fuel, and air plasma spray.

44. The method of claim 35, wherein the desired coating is selected from the group consisting of thermal barrier coatings, environmental protection coatings, and wear coatings.

45. The method of claim 35, wherein the desired coating comprises a metallic bond coating and an overlying thermal barrier coating.

46. The method of claim 35, wherein the channels have an average depth which is about 5 microns to about 100 microns, and an average width which is about 20 microns and about 400 microns.

* * * * *